United States Patent [19]

de La Chapelle et al.

[11] Patent Number: 5,055,810
[45] Date of Patent: Oct. 8, 1991

[54] ULTRA-HIGH SPEED LIGHT ACTIVATED MICROWAVE SWITCH/MODULATION USING PHOTOREACTIVE EFFECT

[75] Inventors: Michael de La Chapelle; Hui-Pin Hsu, both of Canoga Park, Calif.

[73] Assignee: Hughes Aircraft Company, Los Angeles, Calif.

[21] Appl. No.: 576,140

[22] Filed: Aug. 29, 1990

Related U.S. Application Data

[63] Continuation of Ser. No. 306,004, Feb. 2, 1989, abandoned, which is a continuation of Ser. No. 948,338, Dec. 31, 1986, abandoned.

[51] Int. Cl.$^5$ .............................................. H01P 1/15
[52] U.S. Cl. ................................ 333/262; 250/211 J; 307/311; 332/175
[58] Field of Search ............... 333/103, 104, 247, 262; 307/311; 332/52, 56, 164, 175-178

[56] References Cited

U.S. PATENT DOCUMENTS

| | | | |
|---|---|---|---|
| 3,205,493 | 9/1965 | Cohen | 333/103 X |
| 3,221,272 | 11/1965 | Aoki et al. | |
| 3,502,884 | 3/1970 | Perlman et al. | 250/211 |
| 3,917,943 | 11/1975 | Auston | 250/211 J |
| 3,976,873 | 8/1976 | Bottka et al. | 250/211 |
| 4,376,285 | 3/1983 | Leonberger et al. | 357/17 |
| 4,396,833 | 8/1983 | Pan | 250/211 J |
| 4,531,143 | 7/1985 | Maserjian | 357/23.6 |
| 4,636,794 | 1/1987 | McGinn | 333/231 |
| 4,673,958 | 6/1987 | Bayraktaroglu | 333/247 X |
| 4,675,624 | 6/1987 | Rosen et al. | 333/164 |

FOREIGN PATENT DOCUMENTS 5333083 5/1978 Japan.

OTHER PUBLICATIONS

W. Platte, *Optoelectronic Microwave Switching*, IEE Proc., vol. 32, Part J, No. 2, Apr. 1985, (Old Woking, GB), pp. 126-132.
T. Yamamoto et al.; "The gold n-type GaAs surface barrier diode and its application to photocapacitors", Solid-State Electronics, vol. 11, No. 2, Feb. '68 pp. 219-224.
R. A. Kiehl; "An avalanching optoelectronic microwave switch", IEEE Trans. on Microwave Theory and Techniques; vol. MTT-27, No. 5, May 1979, pp. 533-539.
P. R. Herczfeld et al.; "Optically controlled microwave devices and circuits"; R.C.A. Review, vol. 46, No. 4, Dec. 1985, pp. 528-551.

*Primary Examiner*—Paul Gensler
*Attorney, Agent, or Firm*—C. D. Brown; R. M. Heald; W. K. Denson-Low

[57] ABSTRACT

The RF/microwave switch/modulator uses an optically controlled diode 20. The reactance of the diode may be varied by varying the illumination intensity. In this fashion, the photodiode in conjunction with an external circuit can switch or modulate a microwave signal by varying the reactance of the diode using a laser light source or the like. The bias voltage may be varied to electronically tune the diode so that the microwave frequency of operation can be electronically controlled.

23 Claims, 6 Drawing Sheets

*Fig-11B* $L_R = \dfrac{1}{W_0^2 C_{d4}}$

ULTRA-HIGH SPEED LIGHT ACTIVATED MICROWAVE SWITCH/MODULATION USING PHOTOREACTIVE EFFECT

This is a continuation of application Ser. No. 07/306,004 filed Feb. 2, 1989 which was a continuation of application Ser. No. 06/948,338 filed Dec. 31, 1986 both now abandoned.

BACKGROUND OF THE INVENTION

1. Field of the Invention

The invention relates generally to microwave switches and modulators. More particularly, the invention relates to a microwave switch/modulator which is controlled by optical illumination from a laser light source or the like. The illumination causes variations in the reactance of the switch/modulator photodiode, thereby detuning a resonant circuit, causing RF signals to be reflected rather than absorbed or transmitted. The microwave switch/modulator is also electronically tunable so that the microwave frequency of operation can be varied by adjusting the reverse bias voltage to the photodiode.

2. Description of Related Art

High-speed RF and microwave switches are used in numerous applications. They are often used in radar receivers as blanking switches to protect sensitive circuitry from damage during the transmit pulse. Fast switching is necessary for this application in order to minimize the period of time in which the receiver is disabled after the transmit pulse has ended so the radar can detect close targets.

Heretofore, high-speed RF and microwave switches have employed optoelectronic microwave switching technology, which relies on photoconduction to achieve microwave switching. Photoconductivity is an increase in conductivity with illumination. Thus prior art optoelectronic switches rely on a change in the device resistance to effect the switching function.

Prior art optoelectronic microwave switches can be classified according to the means of operation. Plasma switches work by forming a highly conductive plasma in the electrical path of a microwave transmission line. The plasma-forming semiconductor material can be placed as a shunt element, a series element or both. See Platte "Optoelectronic Microwave Switching", IEE Proceedings, Volume 132, No. 2. pp 126-132, April, 1985.

It has also been proposed to use light of two different wavelengths to turn on and off a plasma switch constructed as a simple gap in a microstrip transmission line on a semiconductor substrate. One wavelength of light is absorbed in the surface of the semiconductor and forms a conducting plasma across the microstrip gap allowing RF transmission. The other wavelength penetrates deep into the semiconductor, forming a conducting plasma to ground which reflects the incident RF energy. For more information on this technique, see A. M. Johnson, D. H. Auston, "Microwave Switching By Picosecond Photoconductivity", IEEE - QE, Volume QE-11, No. 6, pp 283-287, June, 1975.

Plasma switches turn on very rapidly (10-100 pS) but turn off very slowly (1 uS-1 mS) because there is no electric field present to sweep away carriers. The turn-off time is determined by carrier recombination unless some means of shunting is used as described above. A second disadvantage of the plasma switch is the requirement for a high-powered laser to form a plasma over a large region or surface.

Avalanche photodiode switches have been used as microwave switches because of their high photoconductivity. The diode is typically biased near avalanche breakdown, where a small amount of illumination causes ionization in the high field region. The electron-hole pairs in turn ionize other atoms creating large photocurrents through multiplication. For more information on this effect, refer to R. A. Kiehl, "An Avalanching Optoelectronic Microwave Switch", IEEE - MTT, Volume MTT 27, No. 5, pp 533-539, May, 1979. Avalanche photodiodes switch comparatively slowly because the avalanche process takes time to build. Also, they are noisy and can have thermal problems.

Bias controlled optoelectronic switches represent a whole class of switches which use bias control to turn optical detectors on and off. For instance, a photodiode can switch on and off the detected microwave modulated illumination from a laser by transitioning from reverse to forward bias, respectively. In other words, photodiode detectors only function in reverse bias. When they are switched to forward bias, they will not detect amplitude modulated microwave energy on an optical carrier. In a similar way, an avalanche photodiode can be turned on and off by switching the bias in and out of avalanche. Bias controlled optoelectronic switches thus rely on changes in bias in order to switch. As a result, this type of switch nas the same speed as a conventional PIN diode switch (on the order of 10 nS).

SUMMARY OF THE INVENTION

The present invention can switch or modulate microwave signals at a factor of 10-1000 times faster than conventional bias controlled microwave switches such as PIN diodes. The invention employs an optically controlled diode which uses changes in diode reactance, rather than resistance, as a mechanism to switch or modulate microwave energy. The optically controlled switch of the invention also enjoys complete isolation between the control circuitry (pulse modulator for the laser) and the microwave switching circuitry, so that no undesirable interference or transients can be coupled into the switched signal. The invention is thus useful in a wide range of high-speed RF and microwave switching applications, including EW receiver blanking switches for applications where a wide bandwidth tuneability can be employed for selectively receiving and nulling jamming signals. The invention is also useful for analog modulator applications where an intensity modulated optical signal can be used to amplitude modulate a microwave signal. The range of applications of the invention includes radar, EW, RF and microwave communications, and signal processing.

BRIEF DESCRIPTION OF THE DRAWINGS

FIG. 8(B) is a graph depicting frequency of peak return loss versus bias voltage showing saturation as the photodiode punches through;

FIGS. 11A and 11B are schematic block diagrams of a photoreactive diode employed in two different two-port transmission/reflection switching schemes.

DESCRIPTION OF THE PREFERRED EMBODIMENTS

Figure 1:
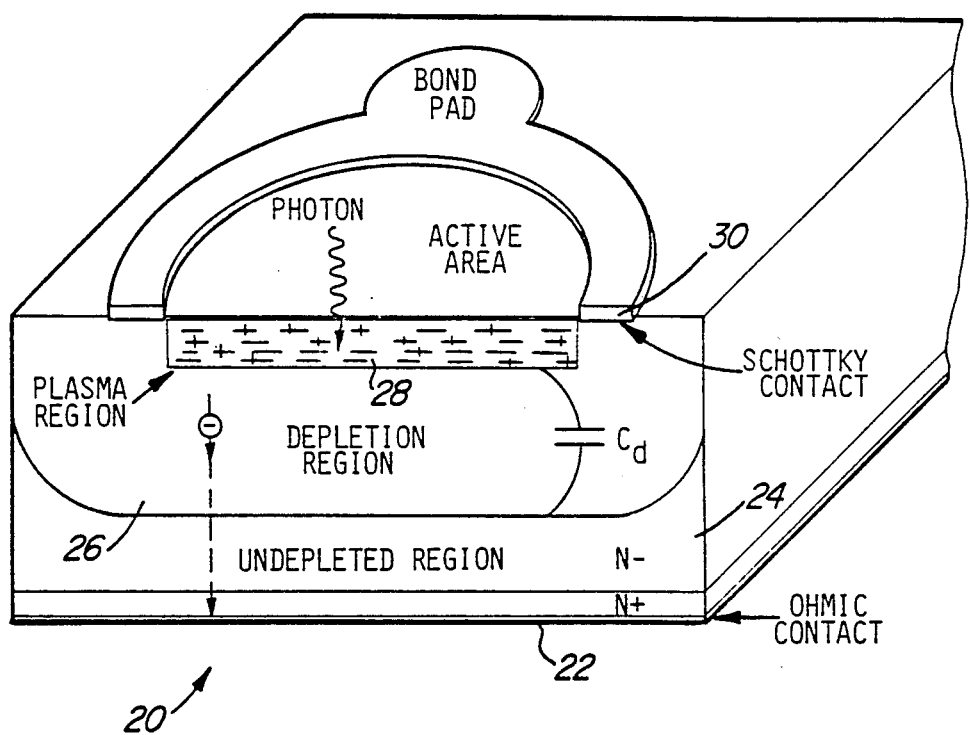
FIG. 1 is a cross-sectional view of a photoreactive diode showing a plasma region formed by laser illumination and a depletion region created by reverse biasing and device.
Figure 2:
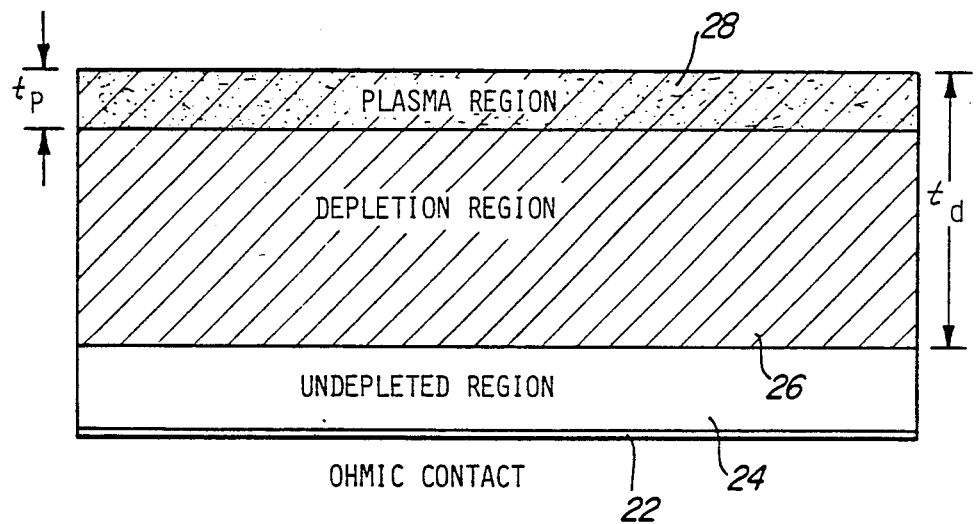
FIG. 2 is a simplified cross-sectional view of a photoreactive diode with regions defined.

The present invention employs a mechanism in which the reactance of the photodiode varies with illumination. This mechanism will be hereinafter referred to as the "photoreactive effect". Photoreactance is caused by the formation of a plasma on the surface of a photodiode resulting from photons colliding with atoms (ionization) in the active region of the device. With reference to FIGS. 1 and 2, the photoreactive diode 20 comprises ohmic contact 22, undepleted region 24, depletion region 26, plasma region 28 and a Schottky contact ring 30. The thickness of the plasma region, $t_p$, increases with illumination on the photodiode. A depletion region of thickness, $t_d$, is formed in a reversed biased diode.

The capacitance of the photodiode can be approximated by the simple parallel plate model as:

$$c_d = \frac{\epsilon A}{t_d - t_p} \quad (1)$$

Where A is the active area of the photodiode and E is the permitivity of the material.

This equation shows that increasing the plasma thickness by increasing the illumination causes the photodiode capacitance to rise.

The depletion thickness as a function of the reverse bias voltage for a Schottky diode is given by:

$$t_d = \sqrt{\frac{2}{qN_d}\left(V_{b1} - V_d - \frac{kT}{q}\right)} \quad (2)$$

where: $N_d$=donor impurity density, $V_{b1}$=built in potential, $V_d$=reverse bias voltage, k is Boltzmann's constant, q is the electronic charge and T=temperature. This equation demonstrates that the depletion thickness increases with bias voltage. Therefore, the maximum photoreactive effect occurs at voltages where the depletion thickness is only slightly larger than the plasma thickness such that $t_d - t_p$ is small.

A photon is absorbed in a semiconducting material creating an electron-hole pair if its energy is greater than or equal to the band gap, $E_g$, i.e., $$h\nu > E_g, \text{ where } \nu = c/\lambda, \text{ h = Planck's constant,} \\ \text{c = speed of light and } \lambda = \text{wavelength of the photon} \quad (3)$$

Therefore, there is a critical wavelength of illumination above which there is transmission and below which there is absorption of photons, i.e., $$\lambda_c = \frac{hc}{E_g} = \frac{1.24}{E_g} \quad (4)$$

As a result, for this invention to function, absorption of photons must occur using illumination at wavelengths less than the critical wavelength, $\lambda < \lambda_c$.

Figure 3:
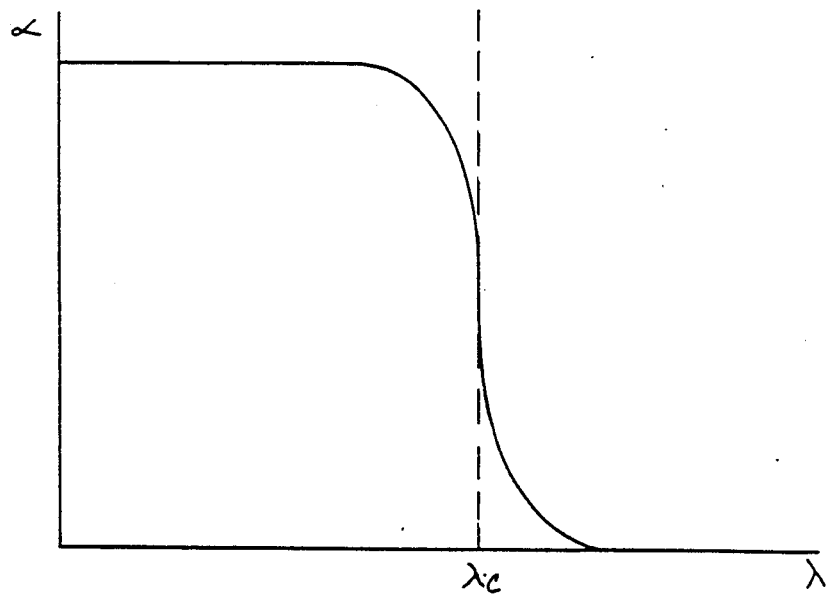
FIG. 3 is a graph depicting absorption coefficient versus wavelength of illumination for a semiconductor.

The absorption coefficient, $\alpha$, is a measure of the degree to which a semiconductor absorbs photons and is, of course, a function of wavelength, as shown in FIG. 3.

Figure 4:
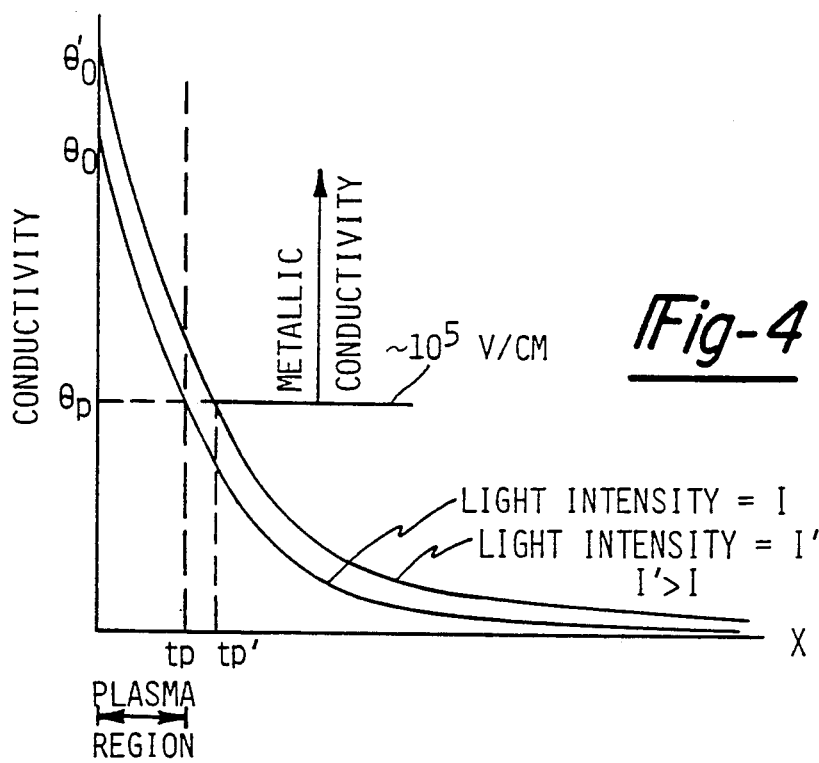
FIG. 4 is a graph depicting conductivity versus depth from the surface of the semiconductor.

The distribution of electron-hole pairs created by illumination of a semiconductor is given by, $$N(x) = N_o e^{-\alpha x} \quad (5)$$

where e = 2.71828, x is distance from the surface where $N_o$ is the surface carrier density. Therefore, $\theta$, the conductivity as a function of depth from the surface of the semiconductor is given by, $$\theta(x) = qN(x)(\mu_n + \mu_p) = qN_o(\mu_n + \mu_p)e^{-\alpha x} \quad (6)$$
$$= \theta_o(I) \cdot e^{-\alpha x}$$

where $\theta_o(I)$ is the surface conductivity which is a function of the illumination intensity, $\mu_n$ is the effective mobility of electrons and $\mu_p$ is the effective mobility of holes. The conductivity versus depth is plotted in FIG. 4 for two different illumination levels. The exponential conductivity distribution can be approximated by a rectangular distribution as depicted by the dotted line in FIG. 4 of conductivity $\theta_p$ and thickness $t_p$. The effective plasma thickness is defined as a region of approximately metallic conductivity, where $\theta_p$ is on the order of $10^5$ mhos/cm or greater. From equation (6), the effective plasma thickness is, $$t_p = \alpha^{-1} \ln[\theta_o(I)/\theta_p] \quad (7)$$

Substituting equations (7) and (2) into (1) gives an approximate expression for the photodiode capacitance as a function of the bias voltage and illumination.

$$C_d = \frac{\epsilon A}{(2\epsilon/qN_d)(V_{b1} - V_d - kT/q) - \alpha^{-1}\ln[\theta_o(I)/\theta_p]} \quad (8)$$

Equation (8) shows that the capacitance increases with increasing illumination and decreasing bias voltage.

The capacitance becomes very large as $t_p$ approaches $t_d$. When $t_p = t_d$ the denominator of equations (1) and (8) go to zero and the capacitance goes to infinity. This occurs when the plasma region spans the depletion region. In this case, there will be a large change in the resistance, as well as the reactance, of the photodiode.

To the first order, the depletion thickness is not affected by the presence of the plasma, since the plasma is charge neutral—containing as many holes as electrons. The equilibrium density of carriers within the plasma region is determined by the rate at which electrons and holes are created, the rate at which they drift and diffuse, and their recombination times. Electrons and holes are separated and carried by the electric field present in the depletion region. The electrons are carried across the depletion region creating an external photocurrent while the holes move in the opposite direction and are immediately collected at the Schottky contact. The space charge of the electrons travelling through the drift region will depress the electric field, but this is considered a second order effect and is neglected.

Figure 5A:
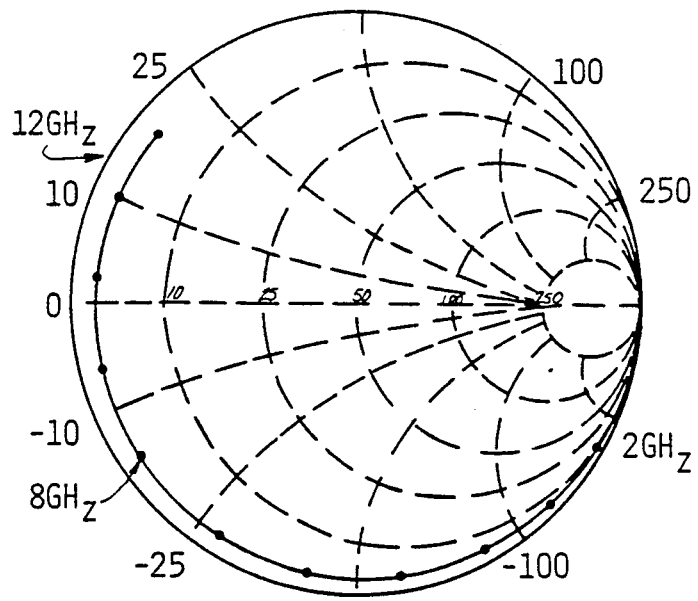
FIG. 5(A) is a Smith chart plot of measured reflection coefficients for an unilluminated photodiode with 8 volts bias.
Figure 5B:
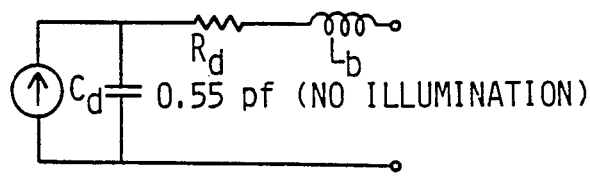
FIG. 5(B) is a schematic diagram depicting a model of photodiode developed from the S-parameters.

The measured reflection coefficients ($S_{11}$) as a function of frequency for an unilluminated 50 μm diameter, GaAs, Schottky photodiode are plotted on the Smith chart of FIG. 5(A). The S-parameter data is fitted to the model of FIG. 5(B) where $C_d$ is the depletion capacitance, $R_d$ is the contact resistance and $L_b$ is the bond wire inductance.

Figure 6:
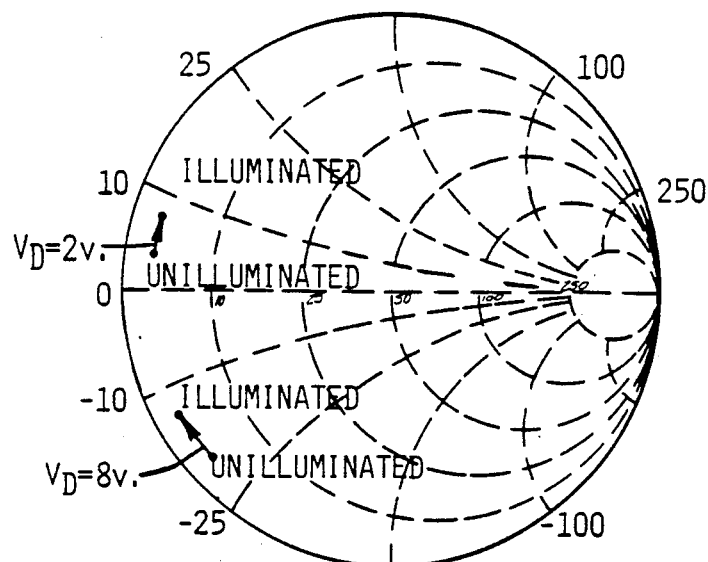
FIG. 6 is a Smith coefficient at 8 GHz due to illumination by a 2 mW, 0.833 μm laser for two different bias voltages.

Illuminating the active area of the photodiode with 2 mW of optical energy from a miniature GaAlAs laser diode causes the reflection coefficient at 8 GHz to slightly shift, as shown in FIG. 6. The change in the $S_{11}$ is purely reactive and corresponds to an increase in the depletion capacitance from 0.52 pF to 0.59 pF with illumination for 8 volts bias. With 2 volts bias the capacitance changes from 1.47 pF to 1.81 pF with illumination. There is a larger change in junction capacitance at 2 volts bias than at 8 volts bias (23% versus 7.3%). This is due to the fact that the depletion thickness is much narrower at 2 volts bias than at 8 volts bias.

Figure 7A:
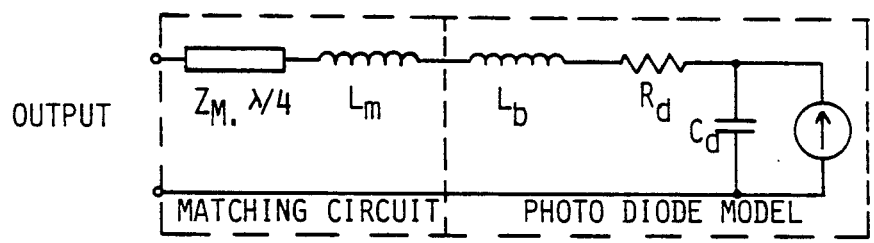
FIG. 7(A) is a schematic diagram of a resonant impedance matching circuit required in conjunction with the invention.

A simple microwave matching circuit was designed and fabricated which matches 50 Ohms to the impedance of the unilluminated diode at 8 GHz. The matching circuit consisted of a series inductor and a quarter wavelength impedance transformer, as shown in FIG. 7A. The series inductor is chosen to resonate the unilluminated capacitance of the photodiode, $C_{du}$, at 8 GHz.

$$L_m = \frac{1}{w^2 C_{du}} - L_b = 0.24 nH. \qquad (9)$$

$L_m$ eliminates the reactive part of the photodiode impedance leaving the real part, $R_d$. $R_d$ is matched to 50 Ohms using a standard quarter wavelength transformer of impedance, $Z_m$, where $$Z_m = \sqrt{50 \cdot R_d} = 12 \text{ Ohms} \qquad (10)$$

Figure 7B:
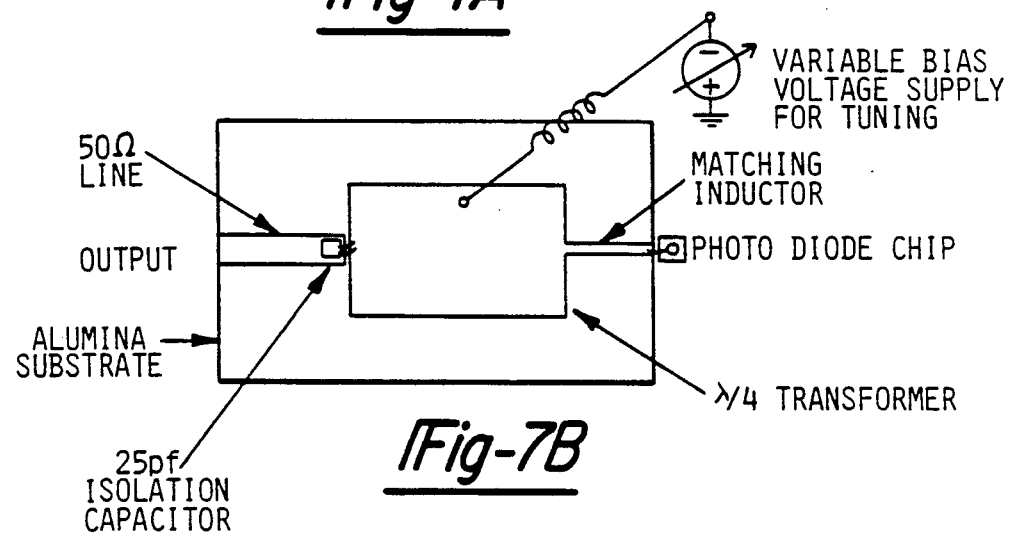
FIG. 7(B) is a layout of the circuit of FIG. 7(A) on microstrip substrate.

A transformer of such low impedance can be conveniently realized on microstrip using a thin substrate of high dielectric constant. For these reasons, 10 mil thick aluminum is chosen. The series matching inductor is realized on microstrip as a short section of high impedance transmission line. A layout of the circuit is shown in FIG. 7(B). Other two-element matching circuits are also suitable this application. These matching circuits may be realized on other microwave transmission media such as coaxial line, waveguide and strip-line.

Figure 8A:
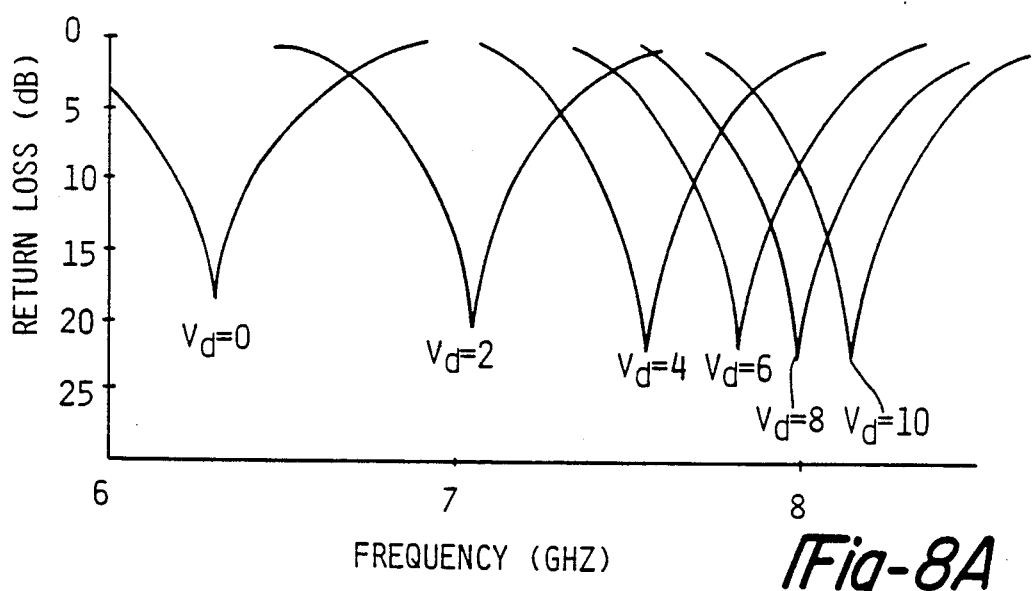
FIG. 8(A) is a graph depicting the return loss versus frequency of a switch using the impedance matching circuit of FIG. 7(A) showing tuning effect of reverse bias voltage.
Figure 8B:
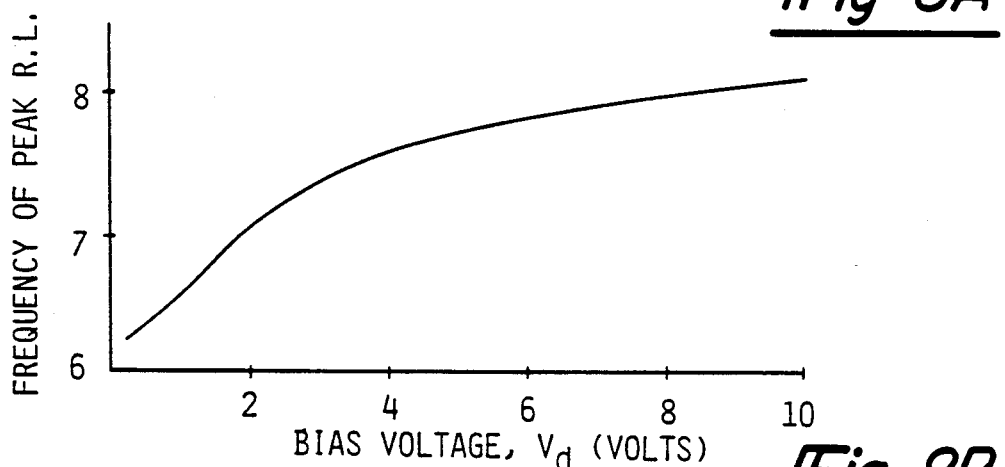

The impedance matching circuit is designed to give a high return loss of its input over a narrow band about the center frequency (8 GHz). The center frequency at which the return loss peaks can be varied by adjusting the reverse bias to the photodiode. The tuning arises from the variation of the depletion capacitance with bias voltage as given by equation (8). A plot of return loss versus frequency for several reverse bias voltages is shown in FIG. 8(A). The frequency at which the return loss peak occurs as a function of bias voltage is plotted in FIG. 8(B). Notice that the frequency levels off at higher bias voltages as the diode punches through.

Figure 9:
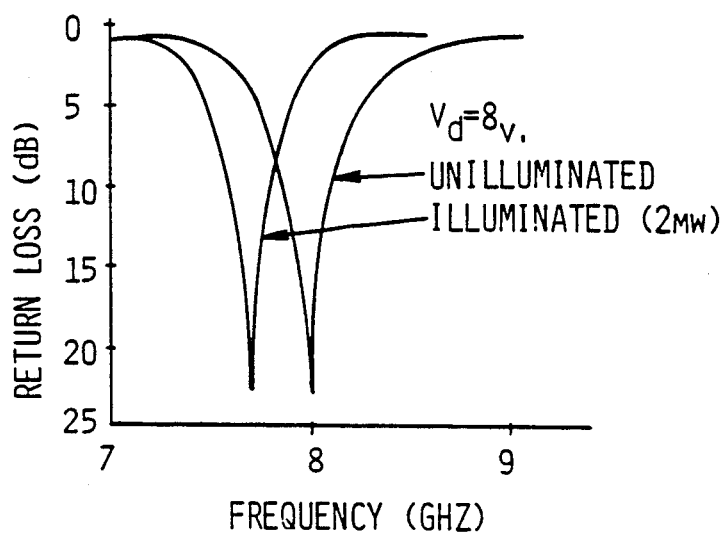
FIG. 9 is a graph depicting return loss versus frequency of a photodiode illiminated with a 2 mW, 0.33 μm laser and further showing the illuminated and unilluminated states.

Illuminating the diode also causes the junction capacitance to vary, as described above. FIG. 9 shows the return loss versus frequency for an illuminated (using a GaAlAs laser of 0.833 μm wavelength) and unilluminated photodiode with 8 volts bias. The resonant frequency shifts by 300 MHz corresponding in a change in $C_d$ from 0.55 pF in the unilluminated state to 0.59 pF in the illuminated state. The increase in capacitance is attributed to the formation of a plasma region in the diode, as described above.

Since the wavelength of the GaAlAs laser optical control signal (0.833 um) is slightly shorter than the critical wavelength of the GaAs photodiode (0.900 um), photons are absorbed in the photodiode to create a plasma, as described by equation (4).

FIG. 9 shows that the return loss at 8 GHz can be made to vary from 25 dB to 3 dB simply by illuminating the photodiode with 2 mW of optical power. The light is directed to the active area of the photodiode by an optical fiber.

Figure 10A:
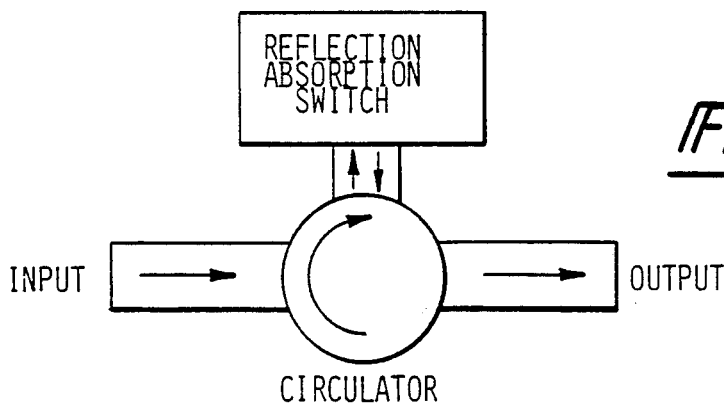
FIG. 10(A) is a schematic block diagram of the reflection/absorption switch using a circulator to separate the input and output signals.
Figure 10B:
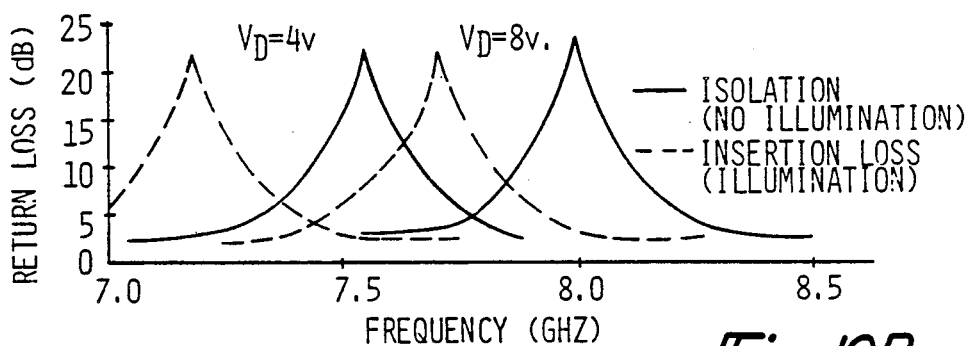
FIG. 10(B) is a graph depicting isolation/insertion loss versus frequency, showing actual switch performance for two bias voltages.

The circuit can be made into a useful switch by connecting a circulator on the input (see FIG. 10(A)). When the return loss of the circuit is high, the incident energy is absorbed and the switch is in the high isolation state. When the return loss is low, incident energy is reflected and the device is in the low insertion loss state. The performance of the switch at two different bias voltages is shown in FIG. 10(B). Notice that the frequency shift due to illumination is much greater for smaller reverse bias voltages, as explained by equation (8).

Even though the invention is inherently narrow banded (5%), the center frequency of operation can be electronically tuned over a 25% band width by varying the reverse bias voltage. The invention has demonstrated operation at X-band, although it is theoretically possible to design a photoreactive switch/modulator which functions at MMW frequencies.

This invention switches states on the order of 10 pS, which is the time it takes to form the conducting plasma. The turn off time is determined by the time it takes for the plasma to recombine, diffuse, or be swept away by the electric field. The advantage of this switch is that the plasma is formed in a high electric field region so that most of the carriers are rapidly swept away when the illumination is stopped. Other plasma switches operated by photoconductive described in technical journals form plasmas in bulk semiconductors with no electric field to sweep away carriers. The turn off time for other plasma switches is determined by the recombination time of the carriers.

This invention can use a low power laser to generate the optical control pulses or modulation. A laser is a threshold device—when the bias current exceeds some threshold value it begins to lase almost instantaneously. The Ortel Corporation laser may be used to switch the invention off and on at picosecond speeds. Test equipment does not exist which permits the measurement of such fast picosecond pulses. Instead, we determined the switching speed of the device by modulating the laser control signal with a sine wave at X-band frequencies. The photodiode responded to X-band optical control signals indicating a switching speed on the order of 10 pS, which is a factor of 1000 improvement over a conventional PIN diode switch.

Figure 11A:
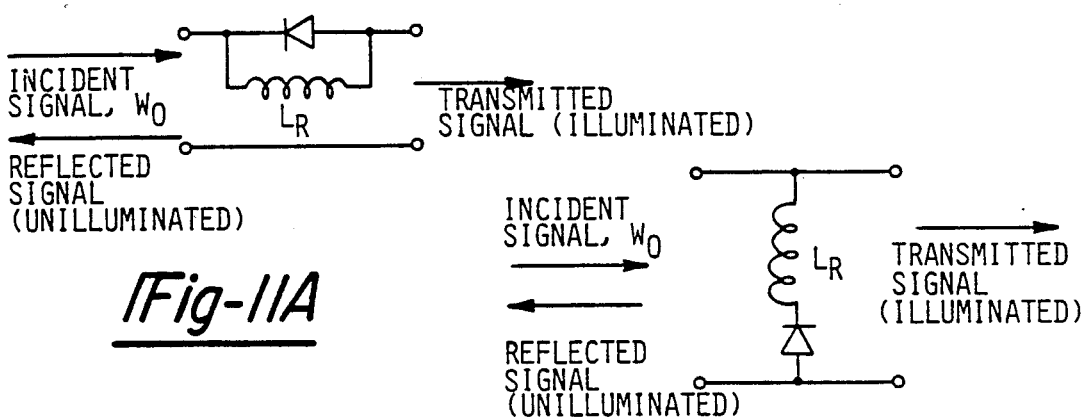

Of particular interest for some practical applications is a two-port transmission/reflection switch using a photoreactive diode rather than the one-port reflection-/absorption switch described above. The former does not require a circulator to separate the input and output signals and can be used to switch higher power RF energy. Schematically, two-port switches could be fabricated as shown in FIG. 11(A) or 11(B). The two schemes function by detuning a high Q resonant circuit when the photodiode is illuminated. The resonant circuit is formed by the unilluminated photodiode capacitance, $C_{du}$, and a resonant circuit inductance, $L_R \cdot L_R$ is chosen according to, $$L_R = \frac{1}{\omega_o^2 C_{du}} \tag{11}$$

where $\omega_o$ is the operating frequency of the switch. Both switches reflect incident microwave signals at frequency $\omega_o$ when the photodiode is illuminated. When unilluminated, the resonant circuit is detuned allowing the signal to be transmitted. The design procedure and functioning of the switch is basically the same as described above.

While the invention has been described in connection with a gallium arsenide (GaAs) semiconductor, for 0.8 μm wavelength illumination, the invention may be practiced with other semiconductor materials as well. In general, the semiconductor material is chosen to suit the particular wavelength illumination. Suitable materials include: silicon (Si), germanium arsenide (GeAs) and gallium arsenide (GaAs) for 0.8 μm illumination; indium gallium arsenide (In GaAs) and indium arsenide phosphate (In GaAsP) for 1.3 μm illumination; and indium gallium arsenide (InGaAs) for 1.55 μm illumination.

From the foregoing, it will be understood that the present invention provides a microwave switch-/modulator which employs the photoreactive mechanism to switch at ultra-high speed. The invention is applicable to a wide range of frequencies including, microwave, RF, and MMW frequencies. While the invention has been described in its presently preferred embodiments, it will be understood that the invention is capable of certain modification and change without departing from the spirit of the invention as set forth in the appended claims.

What is claimed is:

1. A high speed switch comprising:
   a body of semiconductor material having a diode junction therein and contacts on opposing surfaces thereof, said contacts and diode junction defining a microwave shunt reactance device having an operating frequency;
   a photoactive area at one of said surfaces such that said microwave shunt reactance device is switched between a signal matching state and a signal reflecting state in response to a change in illumination intensity upon said photoactive area;
   a source of optical illumination for illuminating said photoactive area; and
   a variable voltage supply coupled to said contacts for changing the voltage supplied by said voltage supply to cause a change in said operating frequency.

2. The switch as claimed in claim 1 wherein one of said contacts is an ohmic contact.

3. The switch as claimed in claim 2 wherein another of said contacts is a Schottky contact.

4. The switch as claimed in claim 1 wherein one of said contacts is a Schottky contact.

5. The switch as claimed in claim 1 wherein said semiconductor material is selected from the group consisting of silicon, gallium arsenide, germanium arsenide, indium, gallium arsenide and indium gallium arsenide phosphate.

6. The switch as claimed in claim 1 wherein said source of optical illumination is a laser.

7. The switch as claimed in claim 1 further comprising: a resonant circuit coupled to said switch, said resonant circuit being selectively detuned when said photoactive area is illuminated.

8. The switch as claimed in claim 7 wherein said resonant circuit is an impedance matching circuit for substantially negating and resonating the reactance of said switch when said photoactive area is unilluminated.

9. The switch as claimed in claim 3 wherein said impedance matching circuit transforms said reactance of switch to a system impedance of nominally fifty ohms.

10. The switch as claimed in claim 8 wherein said impedance matching circuit and said switch define a one-port reflection/absorption switch.

11. The switch as claimed in claim 1 further comprising: a circulator for providing separate input and output ports to said switch.

12. The switch as claimed in claim 1 further comprising: a resonating inductance coupled to said switch to define a two-port transmission/reflection switch.

13. A high speed microwave modulator comprising:
   a body of semiconductor material having a diode junction therein and contacts on opposing surfaces thereof, said contacts and diode junction defining a microwave signal shunt reactance device having an operating frequency;
   a photoactive area at one of said surfaces such that said microwave signal is amplitude modulated in response to modulation of illumination intensity upon said photoactive area;
   a source of optical illumination for illuminating said photoactive area; and
   a variable voltage supply coupled to said contacts for changing the voltage supplied by said voltage supply to cause a change in said operating frequency.

14. The modulator as claimed in claim 13 wherein one of said contacts is an ohmic contact.

15. The modulator as claimed in claim 14 wherein another of said contacts is a Schottky contact.

16. The modulator as claimed in claim 13 wherein one of said contacts is a Schottky contact.

17. The modulator as claimed in claim 13 wherein said semiconductor material is selected from the group consisting of silicon, gallium arsenide, garmanium arsenide, indium, gallium arsenide and indium gallium arsenide phosphate.

18. The modulator as claimed in claim 13 wherein said source of optical illumination is a laser.

19. The modulator as claimed in claim 13 further comprising:
   a resonant circuit coupled to said modulator, said resonant circuit being selectively detuned when said photoactive area is illuminated.

20. The modulator as claimed in claim 19 wherein said resonant circuit is an impedance matching circuit for varying the reactance of said modulator when said source is modulated.

21. The modulator as claimed in claim 20 wherein said impedance matching circuit transforms said reactance of modulator to a system impedance of nominally fifty ohms.

22. The modulator as claimed in claim 13 further comprising:
   a circulator for providing separate input and output ports to said modulator.

23. The modulator as claimed in claim 13 further comprising:
   a resonating inductance coupled to said modulator to define a two-port modulator.

* * * * *